(12) United States Patent
Tanaka

(10) Patent No.: US 8,508,042 B2
(45) Date of Patent: *Aug. 13, 2013

(54) ELECTRONIC DEVICE AND ELECTRONIC APPARATUS

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 259 days.

This patent is subject to a terminal disclaimer.

(21) Appl. No.: 13/015,011

(22) Filed: Jan. 27, 2011

(65) Prior Publication Data

US 2011/0121451 A1 May 26, 2011

Related U.S. Application Data

(63) Continuation of application No. 12/728,474, filed on Mar. 22, 2010, now Pat. No. 8,106,509, which is a continuation of application No. 12/186,587, filed on Aug. 6, 2008, now Pat. No. 7,714,436.

(30) Foreign Application Priority Data

Aug. 20, 2007 (JP) .................................. 2007-213374

(51) Int. Cl.
*H01L 23/485* (2006.01)
(52) U.S. Cl.
USPC ................... 257/737; 257/778; 257/E23.021
(58) Field of Classification Search
USPC ........................ 257/737, 738, 778, E23.023
See application file for complete search history.

(56) References Cited

U.S. PATENT DOCUMENTS

| 6,936,928 | B2 | 8/2005 | Hedler et al. |
| 7,161,245 | B2 | 1/2007 | Saito |
| 7,166,920 | B2 | 1/2007 | Saito et al. |
| 7,576,424 | B2 | 8/2009 | Tanaka |
| 7,705,454 | B2 | 4/2010 | Hashimoto |
| 7,714,436 | B2 * | 5/2010 | Tanaka ........................ 257/737 |
| 7,851,912 | B2 | 12/2010 | Hashimoto |

FOREIGN PATENT DOCUMENTS

| JP | 02-272737 | 11/1990 |
| JP | 2005-175322 | 6/2005 |
| JP | 2005-310815 | 11/2005 |
| JP | 2006-041413 | 2/2006 |
| JP | 2007-042868 | 2/2007 |
| JP | 2007-048812 | 2/2007 |

* cited by examiner

*Primary Examiner* — Roy Potter
(74) *Attorney, Agent, or Firm* — Harness, Dickey & Pierce, P.L.C.

(57) ABSTRACT

An electronic device includes a semiconductor device and a wiring substrate having a wiring pattern. The semiconductor device includes: a semiconductor chip having an electrode; a convex-shaped resin protrusion provided on a surface of the semiconductor chip, the surface having the electrode; and wiring having a plurality of electrical coupling sections which are aligned on the resin protrusion and electrically coupled to the electrode. The semiconductor device is mounted to the wiring substrate so that the electrical coupling sections and the wiring pattern are brought into contact and electrically coupled with each other. The plurality of electrical coupling sections brought into contact with the wiring pattern include curved or bent shapes projecting in a longitudinal direction of the resin protrusion.

12 Claims, 9 Drawing Sheets

ELECTRONIC DEVICE AND ELECTRONIC APPARATUS

CROSS-REFERENCE TO RELATED APPLICATIONS

This application is a continuation application of U.S. Ser. No. 12/728,474 filed Mar. 22, 2010, which is a continuation application of U.S. Ser. No. 12/186,587 filed Aug. 6, 2008, now U.S. Pat. No. 7,714,436 issued May 11, 2010, which claims priority to Japanese Patent Application No. 2007-213374 filed Aug. 20, 2007, all of which are hereby expressly incorporated by reference in their entirety.

BACKGROUND

1. Technical Field

The present invention relates to an electronic device having a semiconductor device mounted to a wiring substrate and an electronic apparatus using the electronic device.

2. Related Art

Technologies for mounting electronic components such as semiconductor integrated circuits (ICs) are used for circuit boards and liquid crystal devices mounted to various types of electronic apparatuses. For example, an IC chip for driving liquid crystal is mounted as a semiconductor device on a liquid crystal display to drive the liquid crystal panel. The IC chip may be mounted directly on a glass substrate which constitutes the liquid crystal panel or on a flexible printed circuit (FPC) which is mounted on the liquid crystal panel. The glass substrate and the FPC are examples of a wiring substrate. The mounting structure of the former is called a chip-on-glass (COG) structure, and the mounting structure of the latter is called a chip-on-FPC (COF) structure.

In a process of mounting the IC chip that drives liquid crystal of the liquid crystal display having the COG structure, an IC chip 1021 is disposed above a glass substrate 1011, with reference to FIG. 12A. Interposed between the IC chip 1021 and the glass substrate 1011 is an anisotropic conductive film (ACF) 1222 containing conductive particles 1222$a$ dispersed in a thermoset resin 1222$b$. Both the IC chip 1021 and the glass substrate 1011 are then heated and pressured, with the conductive particles 1222$a$ therebetween, so as to bring bump electrodes 1021B, 1021B of the IC chip 1021 into an electrical contact state on the alignment sections of electrode terminals 1011$bx$, 1011$dx$ on the glass substrate 1011. The contact state is to be maintained by the cured thermoset resin 1222$b$.

Generally, in order to improve reliability of the conductive connection between the bump electrodes 1021B and the electrode terminals 1011$bx$, 1011$dx$, it is necessary to fix the relative position of the IC chip 1021 to the glass substrate 1011 in a state that the conductive particles 1222$a$ between them are elastically deformed. This is because to maintain the state of electrical contact with the interposed conductive particles 1222$a$ even if the thermoset resin 1222$b$ is thermally expanded due to temperature changes.

However, it is extremely difficult to obtain a predetermined amount of elastic deformation of the conductive particles 1222$a$ because of their minuteness.

Therefore, with reference to FIG. 12B, a technology for composing a bump electrode 1010 is proposed (e.g., see JP-A-2-272737), in which a resin protrusion 1012 is provided above an active surface of the IC chip 1021, and a conductive film 1020 is provided above the surface of this resin protrusion 1012. In this case, an insulating film 1026 is provided in advance on the surface of a pad 1024 of the IC chip 1021, and a portion of the insulating film 1026 is made to open so as to provide a coupling section 1022 to the pad 1024. Then, the conductive film 1020 of the bump electrode 1010 is extended to the coupling section 1022 so that the bump electrode 1010 performs as an electrode terminal of the IC chip 1201.

By pressing the bump electrode 1010 to a terminal of the glass substrate 1011, the resin protrusion 1012 constituting the bump electrode 1010 is elastically deformed. Because the resin protrusion 1012 constituting the bump electrode 1010 is sufficiently larger than the conductive particles 1222$a$ contained in the ACF, a predetermined amount of elastic deformation can be obtained. In this state, the IC chip 1021 is fixed to the glass substrate 1011 using the thermoset resin 1222$b$, so that it becomes possible to maintain the electrical contact state brought by the interposed conductive particles 1222$a$ even if the thermoset resin 1222$b$ is thermally expanded due to temperature changes.

However, because the glass substrate 1011, resin protrusion 1012, conductive film 1020, and thermoset resin 1222$b$ that constitute an electrical contact section made conductive by the bump electrode 1010 have different thermal expansion coefficients, the amount of deformation in each constituent by application of heat varies. Particularly, if the resin protrusion 1012 is convex-shaped, and if the conductive film 1020 is aligned in plurality on the surface of the resin protrusion 1012, the amount of deformation increases near end portions of the resin protrusion 1012 in a longitudinal direction due to the thermal expansion. With the increase in the deformation amount of the resin protrusion 1012, the variation in the deformation amount of each constituent increases, thereby possibly leading to deterioration of the electrical contact state and to conductive disconnection. In this case, the possibility of conductive disconnection between the IC chip 1021 and the glass substrate 1011 is a problem. Therefore, conductive connection that can withstand temperature changes is required, and this is a technology required for the electronic devices.

SUMMARY

An advantage of the invention is to provide an electronic device that withstand temperature changes and maintain stable electric contact.

According to an aspect of the invention, an electronic device includes: a semiconductor device including a semiconductor chip having an electrode; a convex-shaped resin protrusion provided on a surface of the semiconductor chip, the surface having the electrode; and wiring having a plurality of electrical coupling sections which are aligned on the resin protrusion and electrically coupled to the electrode, and a wiring substrate containing a wiring pattern, in that: the semiconductor device is mounted to the wiring substrate so that the electrical coupling sections and the wiring pattern are brought into contact and electrically coupled with each other, and the plurality of electrical coupling sections brought into contact with the wiring pattern include curved or bent shapes projecting in a longitudinal direction of the resin protrusion.

In this case, the plurality of electrical coupling sections brought into contact with the wiring pattern include curved or bent shapes that project in the longitudinal direction of the resin protrusion. Because of these curved or bent shapes, the length of sides constituting each of the plurality of electric coupling sections that have been brought into contact with the wiring pattern may increase. This may increase an electrical contact area, as compared to a straight-lined shape that is not curved or bent. Therefore, despite the variation in the thermal expansion of the wiring substrate, resin protrusion, and the like that constitute the electronic device, the electrical coupling sections may maintain and prevent deterioration of a good electrical contact state. It is therefore possible to provide an electronic device that can withstand temperature changes and maintain stable electric contact.

It is preferable that, in the electronic device, the plurality of electrical coupling sections brought into contact with the wiring pattern be provided such that a first length from an end thereof in a width direction of the resin protrusion to a hypothetical center line of the resin protrusion in the longitudinal direction is longer than a second length from a center thereof in the width direction of the resin protrusion to the hypothetical center line.

It is preferable that, in the electronic device, the plurality of electrical coupling sections in contact with the wiring pattern be provided such that the first length from the end thereof in the width direction of the resin protrusion to the hypothetical center line of the resin protrusion in the longitudinal direction is shorter than the second length from the center thereof in the width direction of the resin protrusion to the hypothetical center line.

In these cases, the plurality of electrical coupling sections brought into contact with the wiring pattern are provided such that the length from its end in the width direction of the resin protrusion to the hypothetical center line of the resin protrusion in the longitudinal direction is longer or shorter than (is different from) the length from its center in the width direction of the resin protrusion to the hypothetical center line. Thus, the plurality of electrical coupling sections brought into contact with the wiring pattern have shapes projecting in the longitudinal direction of the resin protrusion. Because of this projection, the length of sides constituting each of the plurality of electric coupling sections that have been brought into contact with the wiring pattern increases. This may increase the electrical contact area, as compared to the straight-lined shape with no such projection. As a result, despite the variation in the thermal expansion of the wiring substrate, resin protrusion, and the like that constitute the electronic device, the electrical coupling sections may maintain and prevent deterioration of a good electrical contact state. It is therefore possible to provide the electronic device that can withstand temperature changes and maintain the stable electric contact.

It is preferable that, in the electronic device, the plurality of electrical coupling sections brought into contact with the wiring pattern be provided such that a difference between the first length from the end thereof in the width direction of the resin protrusion to the hypothetical center line in the longitudinal direction and the second length from the center thereof in the width direction of the resin protrusion to the hypothetical center line is larger at both end portions of the resin protrusion in the longitudinal direction than at a central portion of the same.

In this case, it is possible to increase the contact area of each of the electrical coupling sections located near the end portions of the convex-shaped resin protrusion in the longitudinal direction, since the deformation of the resin protrusion due to the thermal expansion is maximized at the end portions. As a result, even if the temperature changes occur, it is possible to maintain good electrical contact between the wiring substrate and the electrical coupling sections located near the end portions of the resin protrusion in the longitudinal direction.

It is preferable that, in the electronic device, the plurality of electrical coupling sections brought into contact with the wiring pattern be provided such that the difference between the first length from the end thereof in the width direction of the resin protrusion to the hypothetical center line of the resin protrusion in the longitudinal direction and the second length from the center thereof in the width direction of the resin protrusion to the hypothetical center line increases gradually from the central portion of the resin protrusion in the longitudinal direction toward the both end portions of the same.

In this case, as the deformation of the convex-shaped resin protrusion due to thermal expansion gradually increases toward the end portions of the resin protrusion in the longitudinal direction, the contact area of the electrical coupling section in contact with the wiring pattern may gradually increase. As a result, even if the temperature changes occur, it is possible to maintain good electrical contact between the electrical coupling sections and the wiring substrate.

According to another aspect of the invention, an electronic apparatus includes: the electronic device, and a control section having a function to at least operate a component including the electronic device.

In this case, it is possible to maintain and prevent deterioration of a good electrical contact state of the wiring substrate, resin protrusion, and the like that constitute the electronic device, even if their thermal expansion varies due to the temperature changes. It is therefore possible to provide the electronic device that maintains higher reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the drawings, using an electrooptical device as an example of the electronic device.

Figure 1:
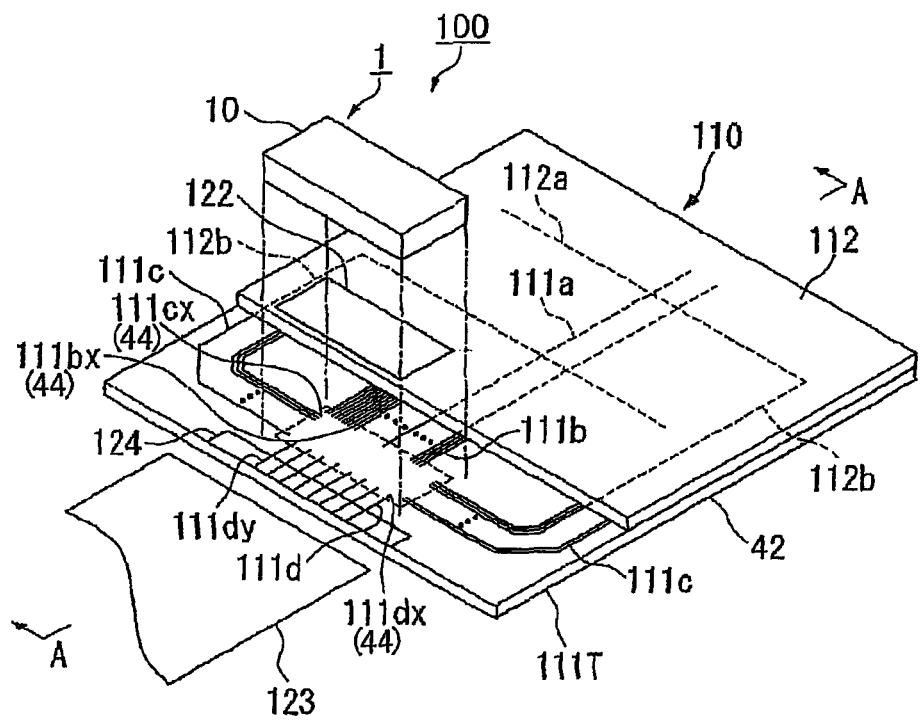
FIG. 1 is a schematic, perspective diagram to explain a liquid crystal device which is an electronic device.

FIG. 1 is a pattern diagram showing a liquid crystal device which is one embodiment of the electrooptical device. A liquid crystal display 100 shown in the drawing includes: a liquid crystal panel 110; and a semiconductor device 1 containing a semiconductor chip 10 for driving liquid crystal 10 (hereunder referred to as semiconductor chip 10). If necessary, incidental members such as a polarizing plate, a reflecting sheet, and a backlight (not shown) may be provided.

Structure of Electrooptical Device

The liquid crystal panel 110 as a wiring substrate includes a base substrate 42 and a substrate 112 made of e.g. glass or plastic. The base substrate 42 and the substrate 112 are arranged opposite from each other and attached to each other with e.g. a seal material (not shown). Filled between the base substrate 42 and the substrate 112 is liquid crystal (not shown) as an electrooptical material. An electrode 111a composed of a transparent electric conductor such as indium tin oxide (ITO) is provided on an inner surface of the base substrate 42. An electrode 112a is provided on an inner surface of the substrate 112, opposite from the electrode 111a. The electrode 111a and the electrode 112a are disposed perpendicular to each other. The electrodes 111a and 112a are drawn to a substrate projection 111T, and electrode terminals 111bx (wiring pattern 44) and electrode terminals 111cx (wiring pattern 44) are provided at an end of this substrate projection 111T. Provided near an edge of the substrate projection 111T is an input wiring 111d. Also provided at an inner end of the substrate projection 111T are terminals 111dx (wiring pattern 44).

Mounted above the substrate projection 111T is the semiconductor device 1, with an adhesive material made of an uncured (state of stage A) or a half-cured (state of stage B) thermoset resin interposed therebetween. The semiconductor device 1 includes, for example, the semiconductor chip 10, electrical coupling sections 32, and resin protrusions 20 which will be described hereafter. Provided on a lower surface of the semiconductor chip 10 are the plurality of electrical coupling sections 32, each of which is conductively connected to the terminals 111bx, 111cx, 111dx (wiring pattern 44) on the substrate projection 111T.

A flexible wiring substrate 123 is mounted above input terminals 111dy provided at an outer end of the input wiring 111d, with an anisotropic conductive film 124 interposed therebetween. The input terminals 111dy is conductively connected to respective wires (not shown) provided on the flexible wiring substrate 123. Then, a control signal, a video signal, a power potential, and the like are supplied from an external section to the input terminals 111dy via the flexible wiring substrate 123. A drive signal for driving liquid crystal is then generated at the semiconductor device 1 and supplied to the liquid crystal panel 110.

According to the liquid crystal display 100 of the embodiment having the structure as described, upon application of a suitable voltage between the electrodes 111a and 112a via the semiconductor device 1, it becomes possible to reorient the liquid crystal of pixel portions, in which both the electrodes 111a and 112a are arranged opposite from each other, to modulate light and to thereby provide a desired image on a display region having pixels aligned in the liquid crystal panel 110.

Figure 2:
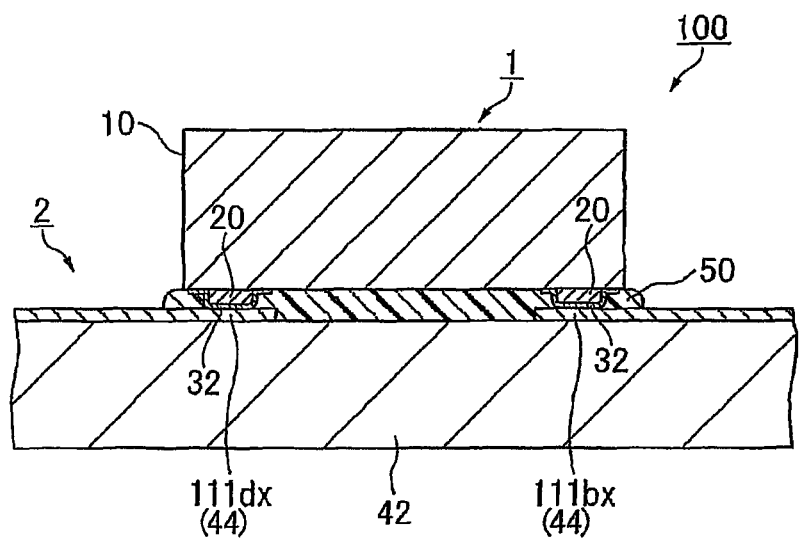
FIG. 2 is a sectional diagram of a semiconductor device taken on A-A of FIG. 1.

FIG. 2 is sectional diagram of a side surface of FIG. 1 taken on an A-A line to explain the mounting structure of the semiconductor device 1 of the liquid crystal display 100. Provided on an active surface (lower surface in the drawing) of the semiconductor chip 10 are: the convex-shaped resin protrusion 20 as a terminal of the side adjacent to the semiconductor, and the plurality of electrical coupling sections 32 provided on the surface of the resin protrusion 20.

The tips of the coupling sections 32 are pressure-welded and thus electrically coupled directly to the terminals 111bx, 111dx of the base substrate 42. The periphery of the electrical contact portion between the coupling sections 32 and the terminals 111bx, 111dx is filled with an adhesive 50 made by curing an adhesive agent such as the thermoset resin.

Structure of Semiconductor Device 1

Figure 3A:
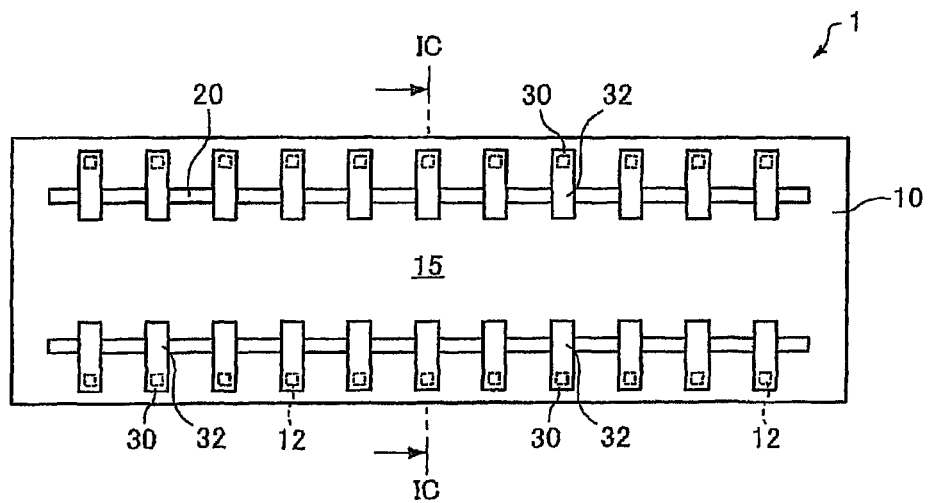
FIGS. 3A through 3C are schematic diagrams to explain the semiconductor device.
Figure 3B:
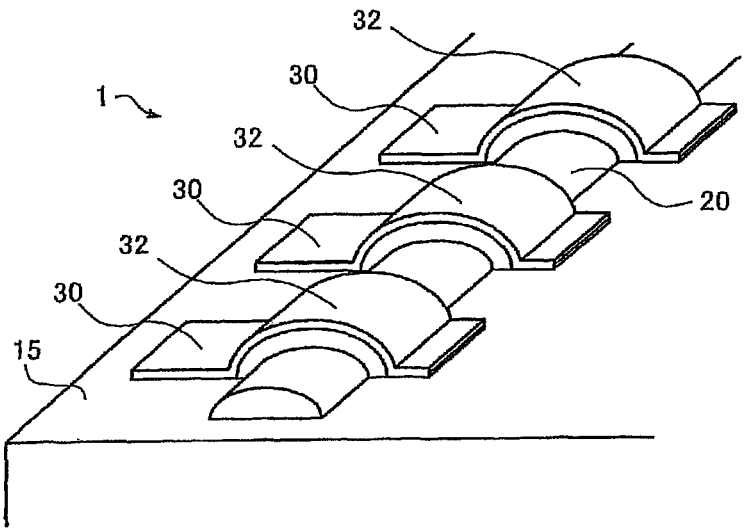
Figure 3C:
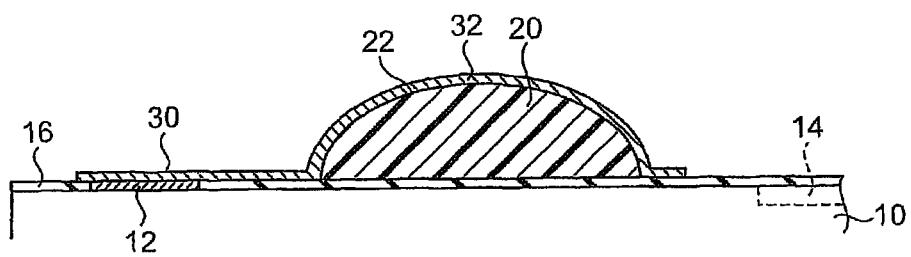

The structure of the semiconductor device 1 according to the embodiment will now be described. FIGS. 3A through 3C are diagrams to explain the semiconductor device 1.

Referring to FIGS. 3A through 3C, the semiconductor device 1 includes the semiconductor chip 10 having electrodes 12 provided thereon. The semiconductor chip 10 may be a silicon chip, for example. The external configuration of a surface 15 of the semiconductor chip 10, the surface having the electrodes 12, is rectangular (rectangle or square). The semiconductor chip 10 includes an integrated circuit 14. Components of the integrated circuit 14 may be, but not limited to, active elements such as transistors and passive elements such as resistors, coils, and condensers.

Referring to FIGS. 3A and 3C, the semiconductor chip 10 includes the electrodes 12. The electrodes 12 are made of metal such as aluminum (Al) or copper (Cu). The electrodes 12 may be electrically coupled to an internal section of the semiconductor chip 10. The electrodes 12 may be electrically coupled to the integrated circuit 14. Conductors (conductive pads) not electrically coupled to the integrated circuit 14 may also be referred to as the electrodes 12. The electrodes 12 may be a part of internal wiring of the semiconductor chip 10. In such a case, the electrodes 12 may be the part of the internal wiring of the semiconductor chip 12 that is used for electrical coupling to the external section. Also, a cap layer such as TiN or Ni may be provided on the surfaces of the electrodes 12.

With reference to FIG. 3C, the semiconductor chip 10 may contain a passivation film 16. The passivation film 16 is provided such that it exposes the electrodes 12. The passivation film 16 may have openings to expose the electrodes 12. The passivation film 16 may be an inorganic insulating film such as $SiO_2$ or SiN or an organic insulating film such as polyimide resin, for example.

With reference to FIGS. 3A to 3C, the semiconductor device 1 according to the embodiment includes the resin protrusions 20. The resin protrusions 20 are provided above the surface 15 of the semiconductor chip 10. Referring to FIG. 3C, the resin protrusions 20 may be provided on the passivation film 16.

The shape of each resin protrusion 20 is not limited to a particular shape. If the external configuration of the surface 15 is rectangular, the resin protrusion 20 may take a shape that extends parallel to any side of the surface 15. For example, if the external configuration of the surface 15 is rectangular, the resin protrusion 20 may take a shape (convex shape) extending along a long side of the rectangle (see FIG. 3A). In this case, the resin protrusion 20 may be arranged in a region near this long side. Then, the plurality of electrical coupling sections 32 are disposed on one resin protrusion 20. Alternatively, the resin protrusion 20 may be circular in top view. In this case, the resin protrusion 20 may be half spherical. In this case, only one electrical coupling section 32 may be disposed on one resin protrusion 20.

The material for the resin protrusion 20 is not limited to any particular material and may be any known material. For example, the resin protrusion 20 may be made of a resin such as polyimide resin, silicone-modified polyimide resin, epoxy resin, silicone-modified epoxy resin, acrylic resin, phenol resin, silicone resin, modified polyimide resin, benzocyclobutene (BCB), or polybenzoxazole (PBO).

The semiconductor device 1 of the embodiment includes wiring 30, with reference to FIGS. 3A through 3C. The wiring 30 is electrically coupled to the electrodes 12. The wiring 30 may be provided so as to come in contact with the passivation film 16. The wiring 30 may extend beyond the resin protrusion 20 and reach over to the passivation film 16. That is, the wiring 30 may come in contact with the passivation film 16 (the surface 15) at both sides of the resin protrusion 20.

Referring to FIGS. 3A through 3C, the wiring 30 includes the electrical coupling sections 32. The coupling sections 32 are regions in the wiring 30 that are disposed on the resin protrusion 20 (see FIG. 3C). The coupling sections 32 are regions of the wiring 30 used for electrical coupling with conductive sections (e.g. the wiring pattern of the wiring substrate) of other electrical components. That is, the coupling sections 32 of the wiring 30 may be regions opposing (coming in contact with) the wiring pattern 44 which will be described hereafter. The wiring 30 is described herein as a single layer of wires. However, the wiring 30 may have multiple layers.

Examples of the material usable for the wiring 30 are, but not limited to, Au, TiW, Cu, Ni, Pd, Al, Cr, Ti, W, NiV, Ag, and lead-free solder.

Method for Manufacturing Semiconductor Device 1

Figure 4A:
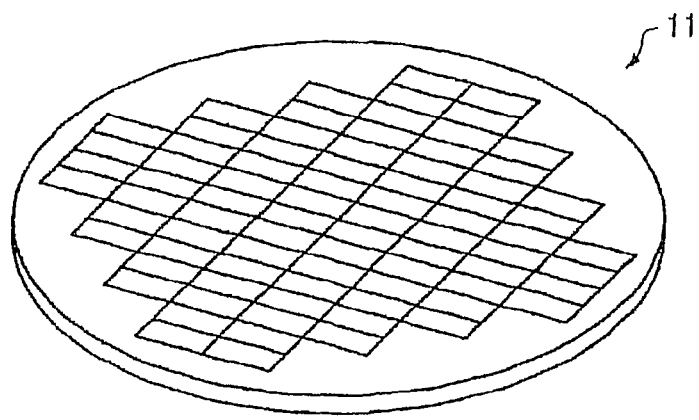
FIGS. 4A through 4C are schematic diagrams to explain a method for manufacturing the semiconductor device.
Figure 4B:
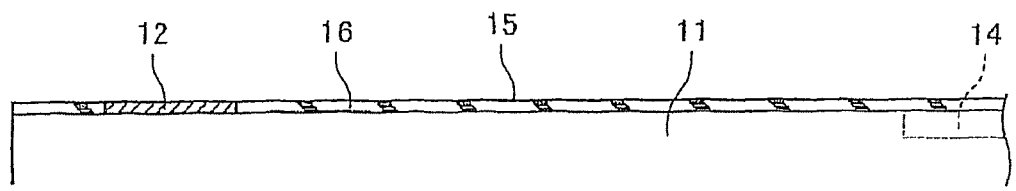
Figure 4C:
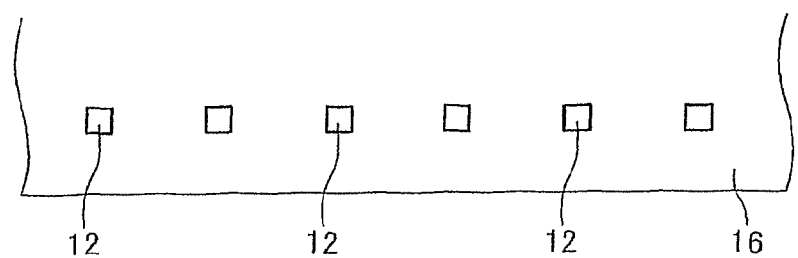

A method for manufacturing the semiconductor device 1 will now be described. FIGS. 4A through 4C are diagrams to explain the method for manufacturing the semiconductor device 1 according to this embodiment.

The method for manufacturing the semiconductor device 1 includes preparing a semiconductor substrate 11 as shown in FIGS. 4A through 4C. FIG. 4A is a schematic diagram of the semiconductor substrate 11. FIG. 4B is a partially enlarged diagram of a cut plane of the semiconductor substrate 11. FIG. 4C is a partially enlarged diagram of an upper plane of the semiconductor substrate 11. The semiconductor substrate 11 may have a shape of a wafer, as shown in FIG. 4A. Alternatively, a semiconductor substrate having a shape of a chip (a semiconductor chip) may be prepared, and then the following process may be conducted. Referring to FIGS. 4B and 4C, the semiconductor substrate 11 includes the electrodes 12. The semiconductor substrate 11 may also include the passivation film 16.

The method for manufacturing the semiconductor device 1 includes forming the resin protrusion 20, with reference to FIGS. 5A through 5D. The procedure for forming the resin protrusion 20 is as follows.

Figure 5A:
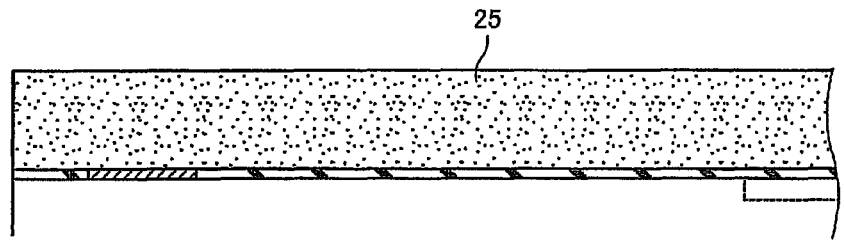
FIGS. 5A through 5D are schematic diagrams to explain the method for manufacturing the semiconductor device.
Figure 5B:
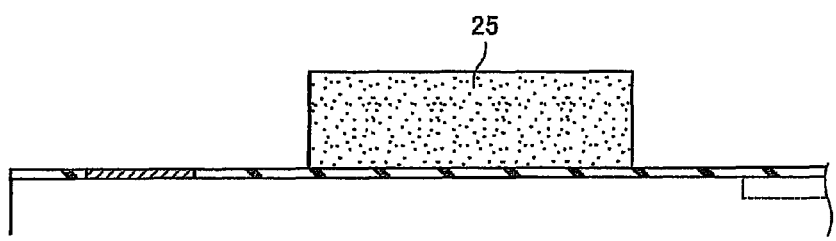
Figure 5C:
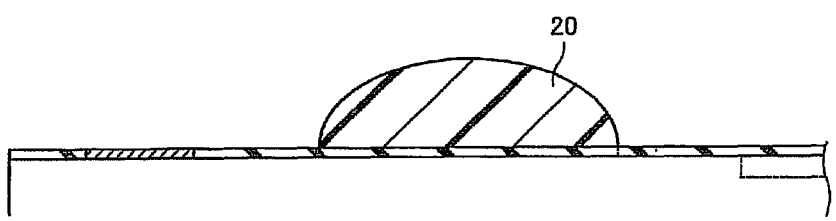
Figure 5D:
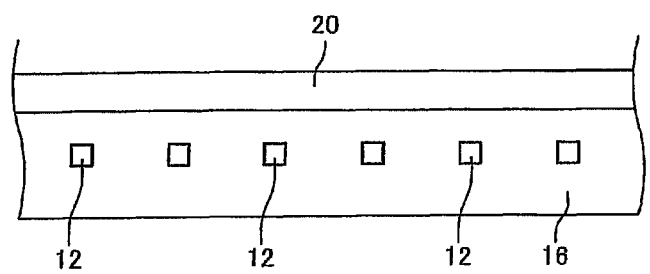

First, with reference to FIG. 5A, a resin material 25 is provided above the semiconductor substrate 11. Then, referring to FIG. 5B, the resin material 25 is partially removed and patterned. Thereafter, the patterned resin material 25 is cured (e.g., thermally cured) to form the resin protrusion 20, with reference to FIGS. 5C and 5D. In this embodiment, the resin protrusion 20 may be formed by melting and then curing the resin material 25. In this case, the shape (the upper plane shape) of the resin protrusion 20 can be controlled by adjusting the melting and curing conditions of the resin material 25. For example, the resin material 25 is heated so as to melt only the surface but not the core thereof (up to a half-melt state) and then cured, so that the upper surface of the resin protrusion 20 is convexed. The shape of the resin protrusion 20 can be controlled by adjusting the configuration, material, curing conditions of the resin material 25.

Figure 6A:
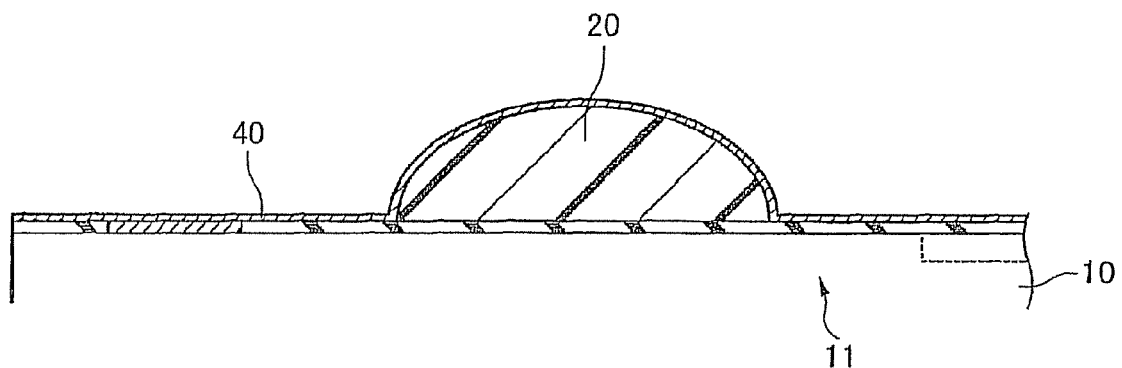
FIGS. 6A and 6B are schematic diagrams to explain an example of a process of providing wiring.
Figure 6B:
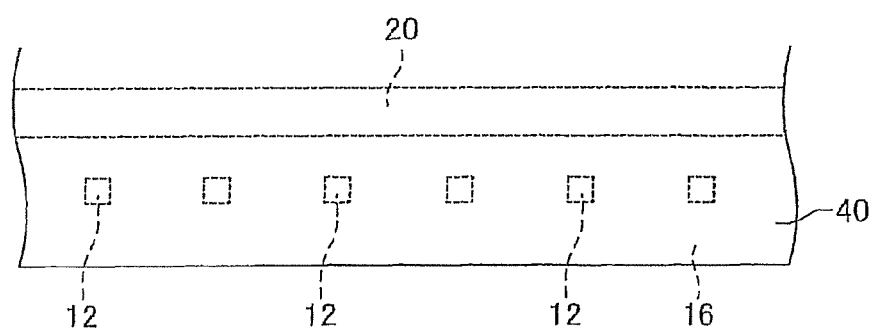

The method for manufacturing the semiconductor device 1 according to this embodiment includes providing the wiring 30. The procedure of providing the wiring 30 will now be described. FIGS. 6A and 6B are diagrams to explain an exemplary process for forming the wiring 30.

First, with reference to FIGS. 6A and 6B, a metal layer 40 is provided above the semiconductor substrate 11. The metal layer 40 may be provided covering the electrodes 12 and the passivation film 16. The metal layer 40 may be electrically coupled to the electrodes 12. The metal layer 40 may be formed by sputtering, for example. An example of the material for the metal layer 40 is, but not limited to, a material of low ductility (a brittle material) having a low electrical resistance value, such as Au.

The metal layer 40 is then patterned, thereby providing the wiring 30 (see FIGS. 3A through 3C).

Then, through processes such as dicing the semiconductor substrate 11, testing, and removing a part of the exposed region of the resin protrusion 20 exposed from the wiring 30, the semiconductor device 1 is provided (see FIGS. 3A through 3C).

Method for Manufacturing Electronic Device

The method for manufacturing the liquid crystal device 100 as one example of the electronic device will now be described. FIGS. 7A through 7D are diagrams to explain the method for manufacturing the liquid crystal device 100 according to the present embodiment.

The method for manufacturing the liquid crystal device 100 according to the embodiment includes preparing a wiring substrate 2. The structure of the wiring substrate 2 will now be described.

The wiring substrate 2 includes the base substrate 42 and the wiring pattern 44. The base substrate 42 (wiring substrate 2) of this embodiment is composed of a part of the liquid crystal panel 110. The base substrate 42 may be a part of another electrooptical panel such as an electroluminescence panel. In such a case, the base substrate 42 may be a ceramic substrate or a glass substrate, for example. Examples of the material for the wiring pattern 44 are, but not limited to, a metal film such as indium tin oxide (ITO), Cr, or Al, a metal compound film, and a compound of these films. The wiring pattern 44 may be electrically coupled to electrodes for driving liquid crystal (e.g., a scanning electrode, a signal electrode, and an opposite electrode). Alternatively, the wiring substrate 2 may be a resin substrate.

The method for manufacturing the liquid crystal device 100 according to the embodiment includes preparing the semiconductor device 1. The semiconductor device 1 may be provided by the method as just described or may have any of the structures as previously described.

The method for manufacturing the liquid crystal device 100 according to the embodiment includes mounting the wiring substrate 2 above the semiconductor device 1. Referring to FIGS. 7A through 7D, the process of mounting the wiring substrate 2 above the semiconductor device 1 will now be described.

Figure 7A:
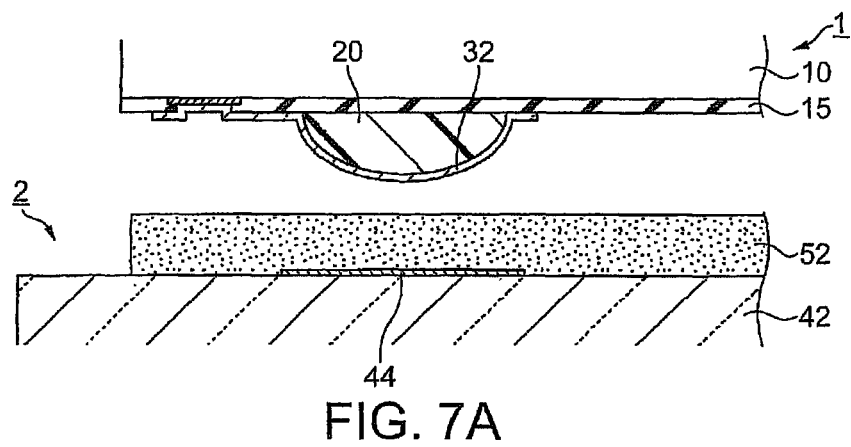
FIGS. 7A through 7D are schematic diagrams to explain a process of mounting the semiconductor device and a wiring substrate.

First, referring to FIG. 7A, the semiconductor device 1 is disposed above the wiring substrate 2. In this case, the semiconductor device 1 is disposed such that the surface 15 of the semiconductor chip 10 faces the wiring substrate 2. Also, the semiconductor device 1 and the wiring substrate 2 are aligned so that the electrical coupling sections 32 (resin protrusion 20) of the semiconductor device 1 lie against (overlap) the wiring pattern 44 of the wiring substrate 2. The alignment of the semiconductor device 1 and wiring substrate 2 may be performed, for example, by holding the semiconductor device 1 using a jig (a bonding tool) (not shown). In this case, the semiconductor device 1 may be held so that the surface 15 lies parallel to the wiring substrate 2. The jig may contain a heater for heating the semiconductor device 1. By heating the semiconductor device 1, the coupling sections 32 are heated, and the coupling sections 32 and the wiring pattern 44 can be electrically coupled successfully.

Referring to FIG. 7A, an adhesive material 52 may be provided in advance between the semiconductor device 1 and the wiring substrate 2. The adhesive material 52 may be paste or film. The adhesive material 52 may be an insulating material that does not contain conductive particles (i.e., nonconductive paste (NCP), nonconductive film (NCF)). The adhesive material 52 may be provided, for example, on the wiring substrate 2.

Figure 7B:
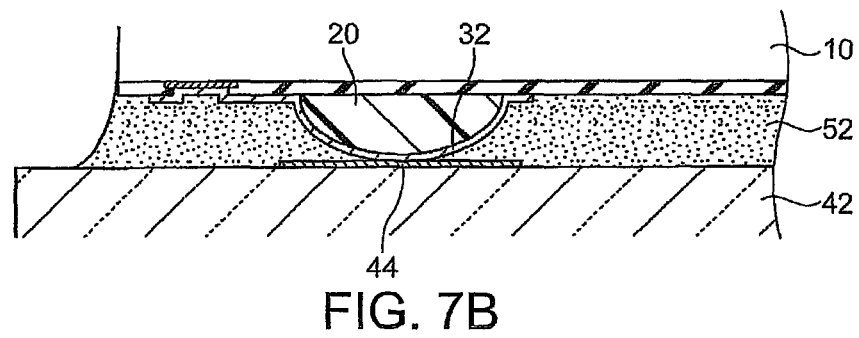
Figure 7C:
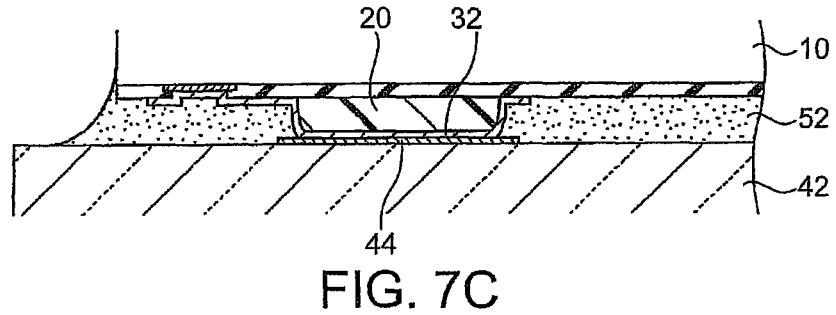

Thereafter, referring to FIG. 7B, the semiconductor device 1 and the wiring substrate 2 are put close to each other so that the coupling section 32 comes in contact and electrically coupled with the wiring pattern 44. In this process, with reference to FIG. 7C, the semiconductor chip 10 and the wiring substrate 2 (base substrate 42) press down and elastically deform the resin protrusion 20. As the resin protrusion 20 is pressed down, each coupling section 32 is also deformed and pressed against the wiring pattern 44. The shapes of the coupling section 32 as pressed against the wiring pattern 44 will be described in detail hereafter. According to this description, however, because the elasticity of the resin protrusion 20 enables each coupling section 32 to be pressed and attached to the wiring pattern 44, it is possible to produce the liquid crystal display 100 with highly reliable electrical connection. Also, in this process, the semiconductor device 1 and the wiring pattern 44 may be put close to each other while flowing the adhesive material 52.

Figure 7D:
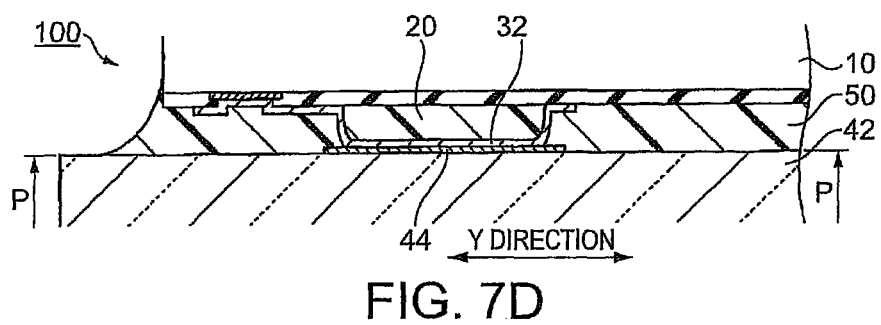

Then, referring to FIG. 7D, the adhesive 50 is provided between the semiconductor device 1 and the wiring substrate 2. The adhesive 50 is provided upon curing of the adhesive material 52. The adhesive 50 adheres (fixes) the semiconductor device 1 to the wiring substrate 2. The gap between the semiconductor chip 10 and the wiring substrate 2 may be maintained by the adhesive 50. That is, with the adhesive 50, the state of the elastic deformation of the resin protrusion 20 may be maintained. For example, by providing the adhesive 50 after the resin protrusion 20 has been elastically deformed, it is possible to maintain the state of the elastic deformation of the resin protrusion 20. As a result, it is possible to manufacture the liquid crystal display 100 having highly reliable electrical connection between the electrical coupling sections 32 and the wiring pattern 44. The material for the adhesive 50 is not particularly limited but may be formed using a resin material, for example. Then, the adhesive material 52 may be the resin material having thermosetting property.

Shapes of the electrical coupling sections 32 pressed against the wiring pattern 44

Figure 8:
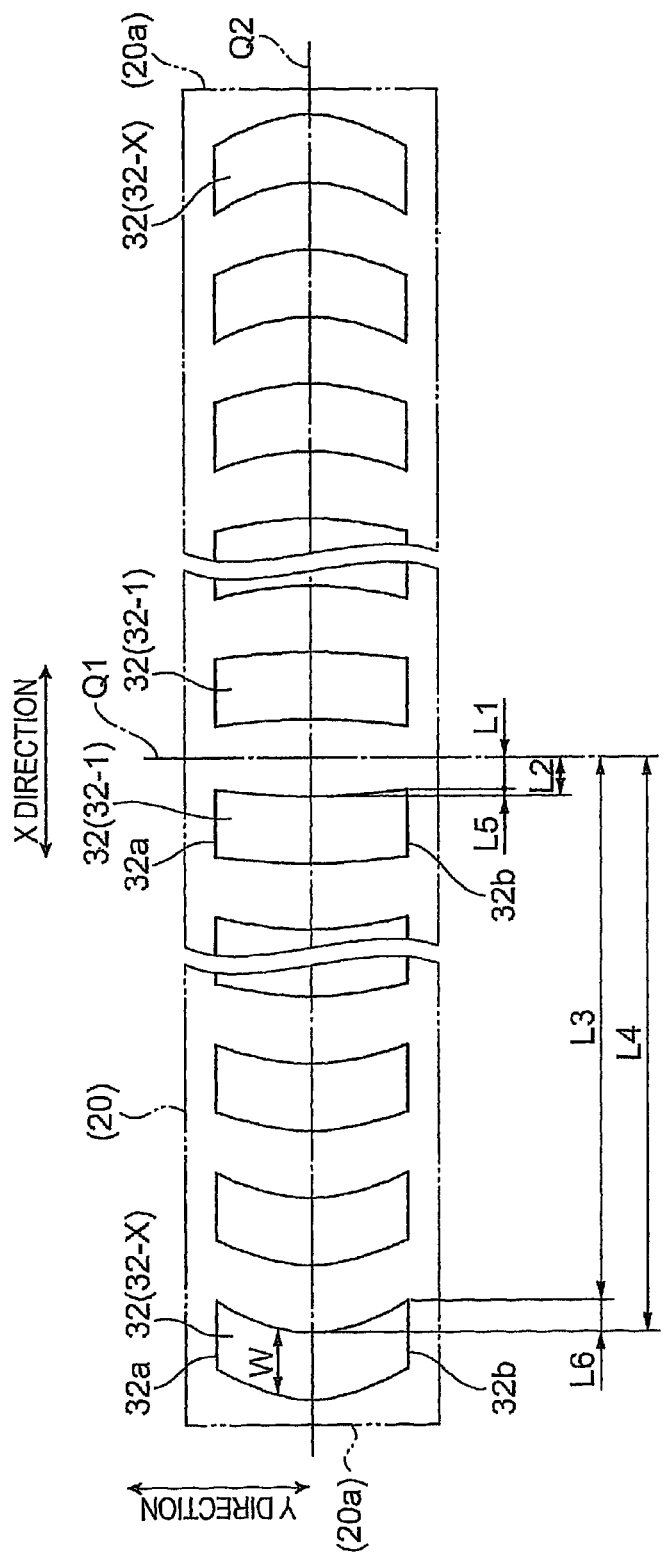
FIG. 8 is a plan diagram of electrical coupling sections that have been pressed, as shown from P-P of FIG. 7D.

The shapes of the electrical coupling sections 32 as pressed against the wiring pattern 44 will now be described in detail with reference to FIG. 8. FIG. 8 is a plan diagram of the pressed electrical coupling sections, as shown from P-P of FIG. 7D.

Referring to FIG. 8, the plurality of electrical coupling sections 32 are provided while being pressed against the wiring pattern 44 in a longitudinal direction (X direction) of the convex-shaped resin protrusion 20. The electrical coupling sections 32, deformed together with the pressed and deformed resin protrusion 20, have predetermined shapes and are in contact with the wiring pattern 44. FIG. 8 shows the shapes of the deformed coupling sections 32 in contact with the wiring pattern 44. The electrical coupling sections 32, namely from electrical coupling sections 32-1 to electrical coupling sections 32-X, are aligned in opposing directions (toward end portions 20a of the resin protrusion 20 in the longitudinal direction) using a hypothetical center line Q1 of the resin protrusion 20 in the longitudinal direction (hereunder referred to as "center line Q1") as a reference. The coupling sections 32 are curved in the directions of the end portions 20a of the resin protrusion 20 in the longitudinal direction. For example, with respect to the coupling sections 32-1, a length L2 from the center line Q1 to a center (nearby a center line Q2) of the resin protrusion 20 in a width direction (Y direction) (hereunder referred to as "width-direction center") is longer than a length L1 from the center line Q1 to ends of the resin protrusion 20 in the width direction (hereunder referred to as "width-direction ends") 32a, 32b. Also, with respect to the coupling sections 32-X, a length L4 from the center line Q1 to the width-direction center is longer than a length L3 from the center line Q1 to the width-direction ends 32a, 32b. Because of such a curved shape, it is possible to increase the electrical contact area compared to the straight-lined shape and to maintain more stable electrical contact.

Described in this embodiment is the example in which the curvature is convexed in the directions of the width-direction ends 32a, 32b. However, if the curvature is concaved in the directions of the width-direction ends 32a, 32b, the contact area also increases, producing the same effect.

Figure 9A:
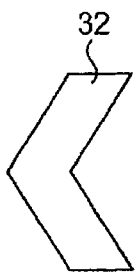
FIGS. 9A through 9C are diagrams showing applications of the shape of the electrical coupling section.
Figure 9B:
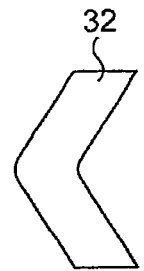
Figure 9C:
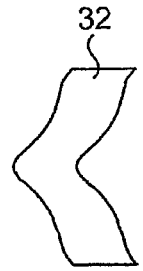

Also, referring to FIGS. 9A through 9C, the shapes of the coupling sections 32 may be curved as mentioned, or bent, or may have a shape combining the curved and bend shapes as long as the contact area increases.

Moreover, referring to FIG. 8, the coupling sections 32 are provided such that the amount of curvature increases gradually from the center line Q1 to the end portions 20a of the resin protrusion 20 in the longitudinal direction (hereunder referred to as the "longitudinal end portions"). In other words, the difference between the length from the center line Q1 to the width-direction (Y-direction) center of the resin protrusion 20 and the length from the center line Q1 to the ends 32a, 32b increases gradually. That is, in the coupling sections 32, the difference between the length from the center line Q1 to the width-direction center and the length from the center line Q1 to the width-direction ends 32a, 32b increases from the center line Q1 toward the longitudinal end portions 20a. To explain this with reference to FIG. 8, with respect to the coupling sections 32-1 near the center line Q1, the difference between the length L2 from the center line Q1 to the width-direction center and the length L1 from the center line Q1 to the width-direction ends 32a, 32b is a difference in length L5. In contrast, with respect to the coupling sections 32-X located near the longitudinal end portions 20a, the difference between the length L4 from the center line Q1 to the width-direction center and the length L3 from the center line Q1 to the width-direction ends 32a, 32b is a difference in length L6.

Thus, the difference in length L6 is greater than the difference in length L5 (L6>L5), and the difference in length increases from the center line Q1 to the longitudinal end portions 20a. In other words, the curvature becomes gradually larger from the center line Q1 to the longitudinal end portions 20a. As the curvature becomes larger, the contact areas of the coupling sections 32 increase gradually from the center line Q1 to the longitudinal end portions 20a. Here, because the convex-shaped resin protrusion 20 is made of resin having a large expansion coefficient, the resin protrusion 20 experiences greater thermal expansion due to environmental temperature changes as compared to the base substrate 42. Thus, the expansion amount at the longitudinal end portions of the resin protrusion 20 is maximized. On the contrary, because the contact area of the coupling sections 32 increases gradually from the center line Q1 to the longitudinal end portions 20a, it is possible to maintain the electrical contact even if the expansion amount at the longitudinal end portions of the resin protrusion 20 increases. Therefore, it is possible to provide the electrooptical device (liquid crystal display 100) capable of withstanding temperature changes and maintaining a stable electrical contact.

As described, the thermal expansion amount of the convex-shaped resin protrusion 20 is at its maximum at the longitudinal end portions 20*a*. Therefore, instead of making the amount of curvature of the coupling sections 32 to increase gradually from the center line Q1 to the longitudinal end portions 20*a*, the same effect can be produced by making the amount of curvature larger near the longitudinal end portions 20*a* than near the center line Q1.

Figure 10:
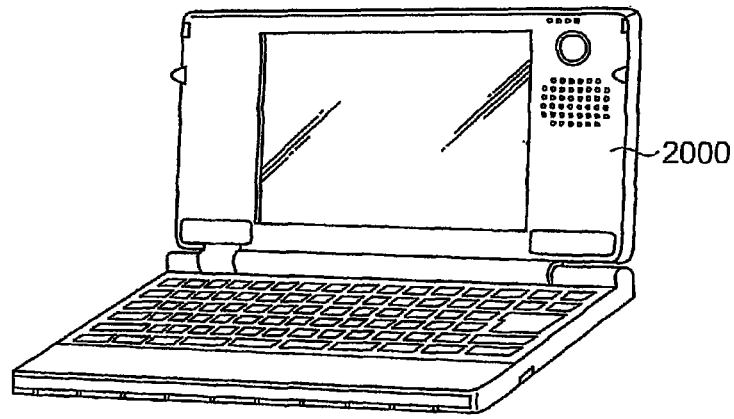
FIG. 10 is a diagram showing an example of an electronic apparatus.
Figure 11:
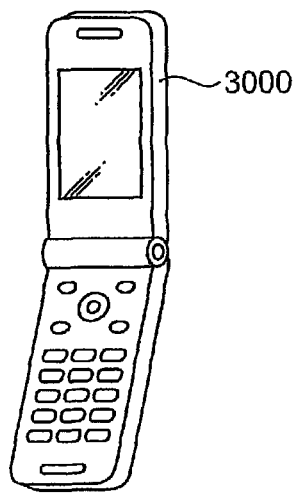
FIG. 11 is a diagram showing an example of the electronic apparatus.
Figure 12A:
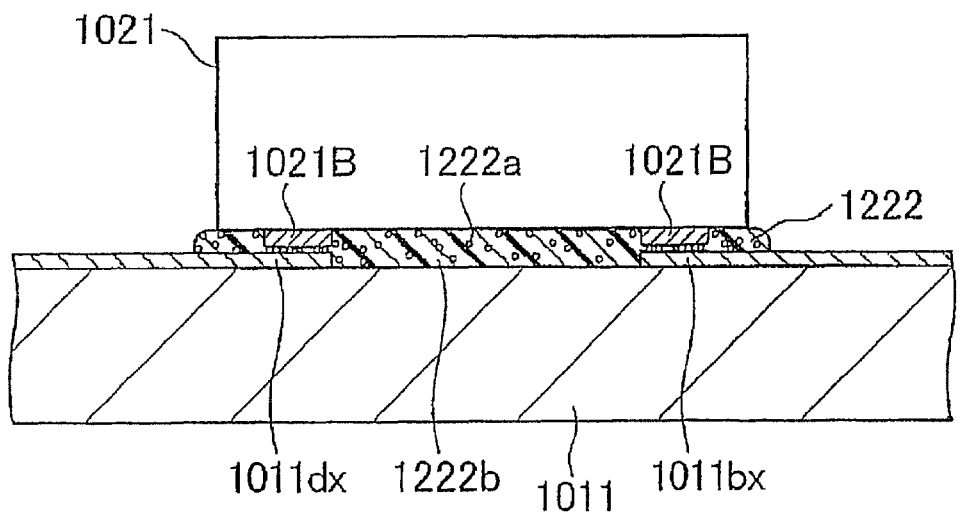
FIGS. 12A and 12B are sectional diagrams to explain a liquid crystal display as an electronic device of a related art
Figure 12B:
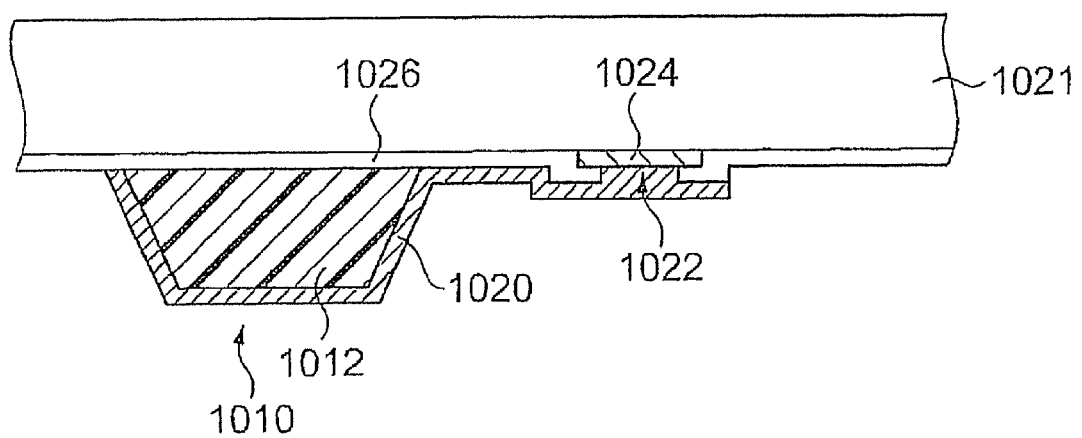

Additionally, it is possible to provide an electronic apparatus which contains the described electronic device and a control section having a function to at least operate components including this electronic device. FIG. 10 shows a notebook type personal computer 2000 as an example of the electronic apparatus, and FIG. 11 shows a mobile phone 3000 as another example of the electronic apparatus. The notebook type personal computer 2000 or the mobile phone 3000 is equipped with the liquid crystal device as an example of the electronic device. The control section (now shown) may be a central processing unit (CPU), for example.

According to the structure as described, it is possible to maintain and prevent deterioration of the good electrical contact state of the wiring substrate, resin protrusion, and the like that constitute the electronic device, even if their thermal expansion varies due to temperature changes. It is therefore possible to provide the electronic device capable of maintaining more stable electric contact.

What is claimed is:

1. An electronic device, comprising:
   a semiconductor device including:
      a semiconductor chip having a plurality of electrodes;
      a resin protrusion provided on a surface of the semiconductor chip, the surface having the plurality of electrodes; and
      wiring having a plurality of electrical coupling sections which are aligned in a first direction on the resin protrusion, the wiring being electrically coupled to the plurality of electrodes; and
   a wiring substrate having a wiring pattern, wherein:
   the semiconductor device is mounted to the wiring substrate so that the electrical coupling sections and the wiring pattern are brought into contact and electrically coupled; and
   at least one of the electrical coupling sections brought into contact with the wiring pattern include curved shapes projecting in the first direction.

2. The electronic device according to claim 1, wherein:
   the plurality of electrical coupling sections brought into contact with the wiring pattern are provided such that a first length from an end thereof in a width direction of the resin protrusion to a center line of the resin protrusion in the first direction is longer than a second length from a center thereof in the width direction of the resin protrusion to the center line.

3. The electronic device according to claim 1, wherein:
   the plurality of electrical coupling sections brought into contact with the wiring pattern are provided such that a first length from an end thereof in a width direction of the resin protrusion to a center line of the resin protrusion in the first direction is shorter than a second length from a center thereof in the width direction of the resin protrusion to the center line.

4. The electronic device according to claim 3, wherein:
   the plurality of electrical coupling sections brought into contact with the wiring pattern are provided such that a difference between the first length from the end thereof in the width direction of the resin protrusion to the center line in the first direction and the second length from the center thereof in the width direction of the resin protrusion to the center line is larger at both end portions of the resin protrusion in the first direction than at a central portion of the resin protrusion in the longitudinal direction.

5. The electronic device according to claim 4, wherein:
   the plurality of electrical coupling sections brought into contact with the wiring pattern are provided such that, the difference between the first length from the end thereof in the width direction of the resin protrusion to the center line of the resin protrusion in the first direction and the second length from the center thereof in the width direction of the resin protrusion to the center line increases gradually from the central portion of the resin protrusion in the first direction toward the both end portions of the resin protrusion in the first direction.

6. An electronic apparatus, comprising:
   the electronic device according to claim 1; and
   a control section having a function to at least operate a component including the electronic device.

7. An electronic device, comprising:
   a semiconductor device including:
      a semiconductor chip having a plurality of electrodes;
      a resin protrusion provided on a surface of the semiconductor chip, the surface having the plurality of electrodes; and
      wiring having a plurality of electrical coupling sections which are aligned in a first direction on the resin protrusion, the wiring being electrically coupled to the plurality of electrodes; and
   a wiring substrate having a wiring pattern wherein:
   the semiconductor device is mounted to the wiring substrate so that the electrical coupling sections and the wiring pattern are brought into contact and electrically coupled; and
   at least one of the electrical coupling sections brought into contact with the wiring pattern include bent shapes projecting in the first direction.

8. The electronic device according to claim 7, wherein:
   the plurality of electrical coupling sections brought into contact with the wiring pattern are provided such that a first length from an end thereof in a width direction of the resin protrusion to a center line of the resin protrusion in the first direction is longer than a second length from a center thereof in the width direction of the resin protrusion to the center line.

9. The electronic device according to claim 7, wherein:
   the plurality of electrical coupling sections brought into contact with the wiring pattern are provided such that a first length from an end thereof in a width direction of the resin protrusion to a center line of the resin protrusion in the first direction is shorter than a second length from a center thereof in the width direction of the resin protrusion to the center line.

10. The electronic device according to claim 9, wherein:
    the plurality of electrical coupling sections brought into contact with the wiring pattern are provided such that a difference between the first length from the end thereof in the width direction of the resin protrusion to the center line in the first direction and the second length from the center thereof in the width direction of the resin protrusion to the center line is larger at both end portions of the resin protrusion in the first direction than at a central portion of the resin protrusion in the first direction.

11. The electronic device according to claim 10, wherein:
    the plurality of electrical coupling sections brought into contact with the wiring pattern are provided such that, the difference between the first length from the end thereof in the width direction of the resin protrusion to the center line of the resin protrusion in the first direction and the second length from the center thereof in the width direction of the resin protrusion to the center line increases gradually from the central portion of the resin protrusion in the first direction toward the both end portions of the resin protrusion in the first direction.

12. An electronic apparatus, comprising:

the electronic device according to claim 7; and a control section having a function to at least operate a component including the electronic device.

* * * * *